(12) United States Patent
Ju et al.

(10) Patent No.: US 11,901,375 B2
(45) Date of Patent: Feb. 13, 2024

(54) ARRAY SUBSTRATE AND METHOD FOR MANUFACTURING THE SAME, AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yongbo Ju, Beijing (CN); Pengfei Cui, Beijing (CN); Jian Sun, Beijing (CN); Deshuai Wang, Beijing (CN); Xiangkai Shen, Beijing (CN); Jianbin Gao, Beijing (CN); Jiannan Wang, Beijing (CN); Guangshuai Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 176 days.

(21) Appl. No.: 17/765,304

(22) PCT Filed: Apr. 13, 2021

(86) PCT No.: PCT/CN2021/086752
§ 371 (c)(1),
(2) Date: Mar. 30, 2022

(87) PCT Pub. No.: WO2021/238463
PCT Pub. Date: Dec. 2, 2021

(65) Prior Publication Data
US 2022/0367530 A1    Nov. 17, 2022

(30) Foreign Application Priority Data
May 29, 2020    (CN) .......................... 202010479718.9

(51) Int. Cl.
*G02F 1/1345*     (2006.01)
*H01L 27/12*      (2006.01)
(Continued)

(52) U.S. Cl.
CPC ...... *H01L 27/1244* (2013.01); *G02F 1/13338* (2013.01); *G02F 1/13458* (2013.01);
(Continued)

(58) Field of Classification Search
CPC ............. G02F 1/13338; G02F 1/13458; G06F 3/04164; G06F 3/0445
(Continued)

(56) References Cited

U.S. PATENT DOCUMENTS

2019/0006389 A1    1/2019  Wang et al.
2019/0258105 A1*   8/2019  Hara ....................... G06F 3/041
(Continued)

FOREIGN PATENT DOCUMENTS

CN    106990635 A    7/2017
CN    107065318 A    8/2017
(Continued)

OTHER PUBLICATIONS

First Office Action for Chinese Patent Application No. 202010479718.9 issued by the Chinese Patent Office dated Apr. 1, 2023.

*Primary Examiner* — Christopher M Raabe
(74) *Attorney, Agent, or Firm* — IP & T GROUP LLP

(57) ABSTRACT

An array substrate has a display area and a bonding area located on a side of the display area. The array substrate includes a base, a plurality of first transistors, a plurality of conductive pins and a plurality of conductive electrodes. The plurality of first transistors are disposed on a side of the base and located in the display area; a first transistor includes a first gate, a first source and a first drain. The plurality of conductive pins are disposed on the side of the base and
(Continued)

located in the bonding area, and are disposed in a same layer as the first gate. The plurality of conductive electrodes are each disposed on a respective one of surfaces of the plurality of conductive pins away from the base.

19 Claims, 8 Drawing Sheets

(51) Int. Cl.
*G06F 3/044* (2006.01)
*G06F 3/041* (2006.01)
*G02F 1/1333* (2006.01)
*H01L 23/00* (2006.01)
*G02F 1/1368* (2006.01)

(52) U.S. Cl.
CPC .......... *G06F 3/0412* (2013.01); *G06F 3/0445* (2019.05); *G06F 3/04164* (2019.05); *H01L 24/03* (2013.01); *H01L 24/05* (2013.01); *H01L 27/1259* (2013.01); *G02F 1/13452* (2013.01); *G02F 1/13685* (2021.01); *G06F 2203/04103* (2013.01); *H01L 24/06* (2013.01); *H01L 2224/0345* (2013.01); *H01L 2224/0362* (2013.01); *H01L 2224/03614* (2013.01); *H01L 2224/05008* (2013.01); *H01L 2224/05013* (2013.01); *H01L 2224/0518* (2013.01); *H01L 2224/05073* (2013.01); *H01L 2224/05124* (2013.01); *H01L 2224/05138* (2013.01); *H01L 2224/05147* (2013.01); *H01L 2224/05166* (2013.01); *H01L 2224/05548* (2013.01); *H01L 2224/05553* (2013.01); *H01L 2224/05566* (2013.01); *H01L 2224/05573* (2013.01); *H01L 2224/05686* (2013.01); *H01L 2224/06165* (2013.01); *H01L 2924/0106* (2013.01); *H01L 2924/0132* (2013.01); *H01L 2924/0549* (2013.01)

(58) Field of Classification Search
USPC .......................................................... 349/12
See application file for complete search history.

(56) References Cited

U.S. PATENT DOCUMENTS

| | | |
|---|---|---|
| 2021/0011571 A1 | 1/2021 | Zhang et al. |
| 2021/0223654 A1 | 7/2021 | Li et al. |

FOREIGN PATENT DOCUMENTS

| | | |
|---|---|---|
| CN | 107121855 A | 9/2017 |
| CN | 107123656 A | 9/2017 |
| CN | 108257980 A | 7/2018 |
| CN | 110349976 A | 10/2019 |
| CN | 111599823 A | 8/2020 |
| KR | 10-2019-0073203 A | 6/2019 |

* cited by examiner

ARRAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/086752 filed on Apr. 13, 2021, which claims priority to Chinese Patent Application No. 202010479718.9, filed on May 29, 2020, which are incorporated herein by reference in their entirety.

TECHNICAL FIELD

The present disclosure relates to the field of display technologies, and in particular, to an array substrate and a method for manufacturing the same, and a display apparatus.

BACKGROUND

Liquid crystal displays (LCDs) have been widely used due to their advantages such as low power consumption, miniaturization, lightness and thinness.

SUMMARY

In an aspect, an array substrate is provided. The array substrate has a display area and a bonding area located on a side of the display area. The array substrate includes: a base, a plurality of first transistors, a plurality of conductive pins and a plurality of conductive electrodes. The plurality of first transistors are disposed on a side of the base and located in the display area, and a first transistor includes a first gate, a first source, and a first drain. The plurality of conductive pins are disposed on the side of the base and located in the bonding area, and the plurality of conductive pins are disposed in a same layer as the first gate. The plurality of conductive electrodes are each disposed on a respective one of surfaces of the plurality of conductive pins away from the base.

In some embodiments, the array substrate further includes: a plurality of touch signal lines disposed on the side of the base and extending in a first direction. The plurality of touch signal lines are disposed in a same layer as the first source and the first drain. At least one touch signal line is electrically connected to one conductive pin.

In some embodiments, the array substrate further includes: a plurality of touch electrodes disposed on a side of the plurality of touch signal lines away from the base. Each touch electrode is electrically connected to at least one touch signal line.

In some embodiments, the array substrate further includes: a planarization layer disposed between the plurality of first transistors and the plurality of touch electrodes. The planarization layer has a plurality of first via holes, and each touch signal line is electrically connected to a touch electrode through at least one first via hole. An orthogonal projection of the planarization layer on the base does not overlap with orthogonal projections of the plurality of conductive pins on the base.

In some embodiments, the array substrate further includes: a plurality of pixel electrodes disposed on a side of the plurality of touch electrodes away from or proximate to the base. One of a first source and a first drain of each first transistor is electrically connected to a pixel electrode. The plurality of conductive electrodes are disposed in a same layer as the plurality of touch electrodes or the plurality of pixel electrodes.

In some embodiments, the array substrate further includes: a plurality of data lines disposed in a same layer as the plurality of touch signal lines and extending in the first direction. Another of the first source and the first drain of each first transistor is electrically connected to a data line. At least one data line is electrically connected to one conductive pin.

In some embodiments, the array substrate further includes: a plurality of connection portions. The conductive pin is electrically connected to the at least one touch signal line through a connection portion.

In some embodiments, in a case where the array substrate includes a plurality of touch electrodes, the plurality of connection portions are disposed in a same layer as the plurality of touch electrodes, and each of the plurality of connection portions and a respective one of the plurality of conductive electrodes are of an integrated structure. Or, in a case where the array substrate includes a plurality of pixel electrodes, the plurality of connection portions are disposed in a same layer as the plurality of pixel electrodes, and each of the plurality of connection portions and a respective one of the plurality of conductive electrodes are of an integrated structure. An end of the connection portion is electrically connected to the at least one touch signal line.

In some embodiments, the connection portion includes a multiplexer. An input end of the multiplexer is electrically connected to the conductive pin, and an output end of the multiplexer is electrically connected to at least two touch signal lines.

In some embodiments, the multiplexer includes at least two second transistors, and a second transistor includes a second source and a second drain. One of the second source and the second drain is, as the input end, electrically connected to the conductive pin, and another of the second source and the second drain is, as the output end, electrically connected to one of the at least two touch signal lines.

In some embodiments, the array substrate further includes: an insulating layer disposed between a layer where the first source and the first drain are located and the first gate. The insulating layer is provided with a plurality of second via holes therein, and each touch signal line is electrically connected to a conductive pin through at least one second via hole.

In some embodiments, orthogonal projections of the plurality of conductive pins on the base are each located within an orthogonal projection of a respective one of the plurality of conductive electrodes on the base.

In some embodiments, the array substrate further includes: an insulating layer disposed between a layer where the first source and the first drain are located and the first gate. An orthogonal projection of the insulating layer on the base does not overlap with orthogonal projections of the plurality of conductive pins on the base.

In another aspect, a method for manufacturing an array substrate is provided. The method for manufacturing the array substrate includes: providing a base; the base having a display area and a bonding area located on a side of the display area; forming a plurality of first transistors and a plurality of conductive pins on a side of the base; the plurality of first transistors being located in the display area, and a first transistor including a first gate, a first source and a first drain; the plurality of conductive pins being located in the bonding area and disposed in a same layer as the first gate; and forming a plurality of conductive electrodes each on a respective one of surfaces of the plurality of conductive pins away from the base.

In some embodiments, a step of forming the plurality of first transistors includes: forming a source-drain conductive film on the side of the base; patterning the source-drain conductive film to remove a portion of the source-drain conductive film located in the bonding are, and form a plurality of touch signal lines, and first sources and first drains of the plurality of first transistors in the display area.

In some embodiments, before forming the plurality of conductive electrodes, the method for manufacturing the array substrate further includes: forming a planarization film on a side of the plurality of touch signal lines, the plurality of first transistors, and the plurality of conductive pins away from the base; patterning the planarization film to form first via holes, exposing the plurality of touch signal lines, in the planarization film, and remove a portion of the planarization film located in the bonding area, so as to obtain a planarization layer; an orthogonal projection of the planarization layer on the base not overlapping with orthogonal projections of the plurality of conductive pins on the base.

In yet another aspect, a display apparatus is provided. The display apparatus includes: the array substrate as described in some embodiments as above; an opposite substrate disposed opposite to the array substrate; and a liquid crystal layer disposed between the array substrate and the opposite substrate.

In some embodiments, the display apparatus further includes: a chip on film bonded to the plurality of conductive electrodes in the array substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product and an actual process of a method to which the embodiments of the present disclosure relate.

DETAILED DESCRIPTION

Figure 1:
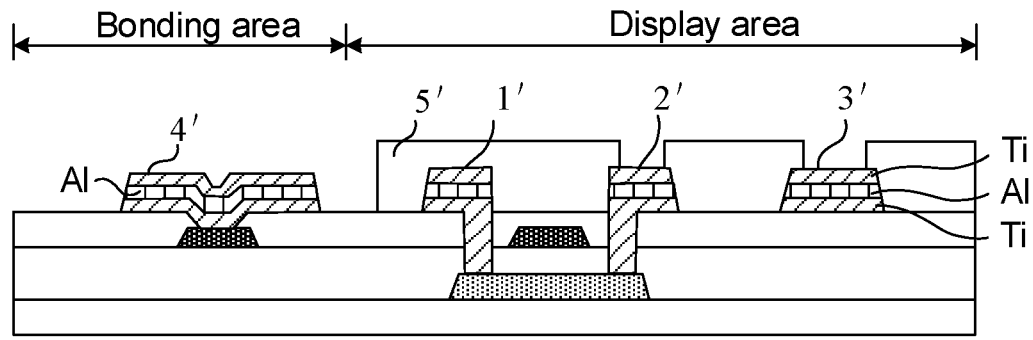
FIG. 1 is a structural diagram of a touch and display driver integration (TDDI) apparatus in the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the term such as "one embodiment", "some embodiments", "exemplary embodiments", "example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, features defined as "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the contents herein.

As used herein, the term "if", depending on the context, is optionally construed as "when" or "in a case where" or "in response to determining that" or "in response to detecting". Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about" or "approximately" as used herein includes a stated value and an average value within an acceptable range of deviation of a particular value. The acceptable range of deviation is determined by a person of ordinary skill in the art in view of measurement in question and errors associated with the measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

In the related art, a liquid crystal display (LCD) may be provided with a touch structure therein. For example, a touch and display driver integration (TDDI) apparatus may be formed. In this way, the TDDI apparatus may not only achieve display of images, but also have a touch function. However, after the touch structure is provided in the LCD, a twill defect of a tear film is easy to occur during display.

The reason why the above defect occurs will be schematically described below by considering the structure shown in FIG. 1 as an example.

In some embodiments, the TDDI apparatus includes a display area and a bonding area located on a side of the display area. The display area is provided with a plurality of transistors (e.g., thin film transistors) therein, and the transistors each include a source 1' and a drain 2' that are disposed in the same layer. The touch structure includes a plurality of touch signal lines 3' located in the display area and a plurality of conductive pads 4' located in the bonding area. The source 1', the drain 2', the touch signal lines 3' and the plurality of conductive pads 4' are disposed in the same layer. A planarization layer 5' is disposed on a side of the touch signal lines 3' and the conductive pads 4'.

In this way, in a process of manufacturing the touch structure, a conductive layer may be deposited first, and then the conductive layer is etched to form sources 1' and drains 2' of the transistors, and the touch signal lines 3 and the conductive pads 4' of the touch structure, and then the planarization layer 5' may be formed. The planarization layer 5' does not cover the conductive pads 4' and exposes side faces of the conductive pads 4', and the planarization layer 5' has via holes for exposing surfaces of the touch signal lines 3' and surfaces of one of the sources 1' and the drains 2'.

The conductive layer is composed of a titanium metal layer, an aluminum metal layer and a titanium metal layer that are sequentially stacked. In a process of forming the planarization layer 5' by using a patterning process (e.g., exposure and development), the side faces of the conductive pads 4' (a material of the side faces including aluminum) may undergo a redox reaction with the surfaces of the touch signal lines 3' and the surfaces (a material of the surfaces being titanium) of the one of the sources 1' and the drains 2' that are exposed by the via holes in the planarization layer 5' in a developing solution (of course, the aluminum included in the side faces of the conductive pads 4' may also undergo a redox reaction with the titanium included in the surfaces of the conductive pads 4' in the developing solution), so that the conductive pads 4', the touch signal lines 3', and the one of the sources 1' and the drains 2' are corroded. As a result, curling phenomena or metal scrap residue phenomena may occur on the conductive pads 4', the touch signal lines 3', and the one of the sources 1' and the drains 2', which in turn causes the twill defect of the tear film of the TDDI apparatus.

Figure 2:
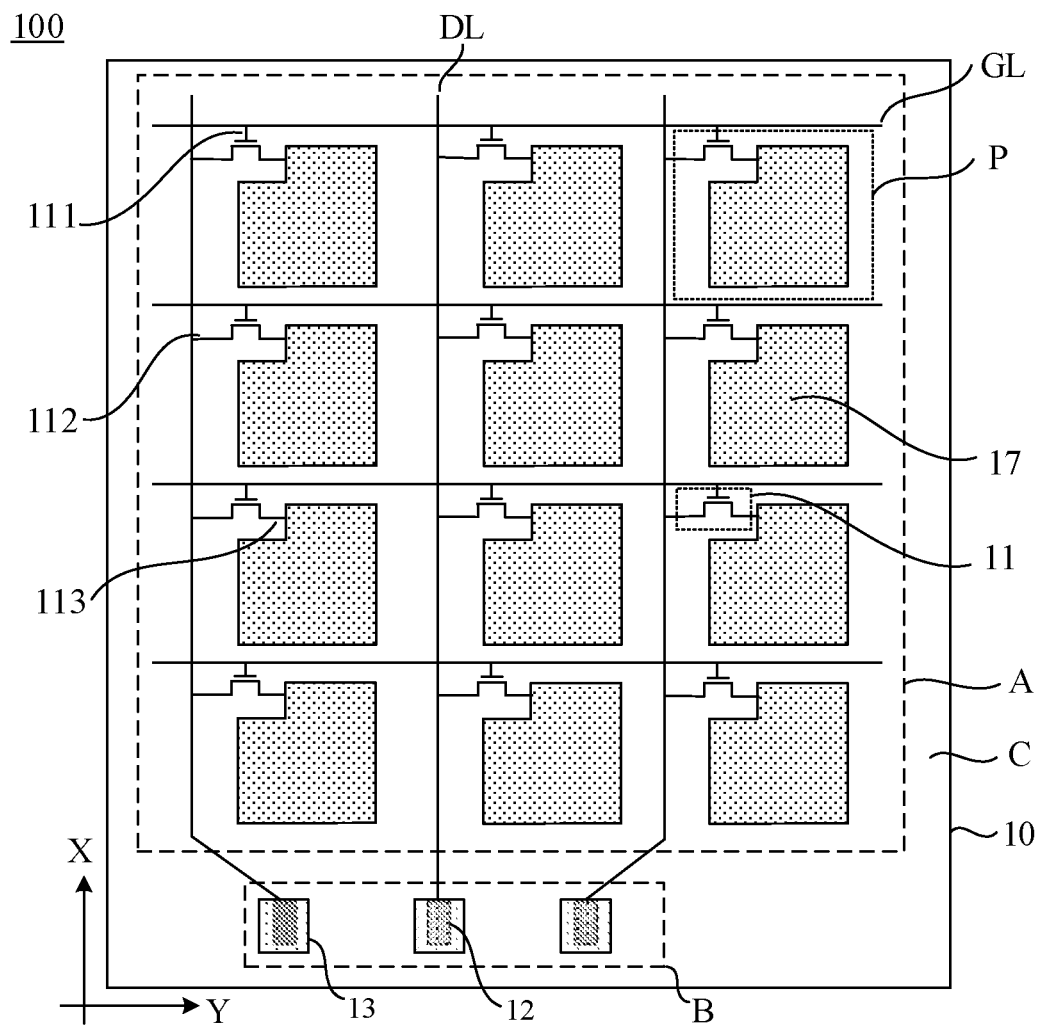
FIG. 2 is a structural diagram of an array substrate, in accordance with some embodiments of the present disclosure.

Based on this, some embodiments of the present disclosure provide an array substrate 100. As shown in FIG. 2, the array substrate 100 has a display area A (the display area A has, for example, a plurality of sub-pixel regions P, and the plurality of sub-pixel regions P may be arranged in an array) and a non-display area C located on a periphery of the display area A. The non-display area C includes a bonding area B, and the display area A and the bonding area B may have a gap therebetween.

In some examples, as shown in FIGS. 2 to 11, the array substrate 100 includes a base 10.

The base 10 may have various structures, which may be selectively set according to actual needs. For example, the base 10 may be a blank base substrate. For another example, the base 10 may include a blank base substrate and a functional film (e.g., a buffer layer) disposed on the blank base substrate.

The blank base substrate may be of various types, which may be selectively set according to actual needs. For example, the blank base substrate may be a polymethyl methacrylate (PMMA) base substrate or a glass base substrate.

In some examples, as shown in FIG. 2, the array substrate 100 further includes a plurality of data lines DL and a plurality of gate lines GL that are disposed on a side of the base 10 and located in the display area A. The plurality of data lines DL extend in a first direction X, and the plurality of gate lines GL extend in a second direction Y.

The plurality of gate lines GL and the plurality of data lines DL intersect and are insulated from each other to define the plurality of sub-pixel regions P.

In some examples, as shown in FIG. 2, the array substrate 100 further includes a plurality of first transistors 11 disposed on the side of the base 10 and located in the display area A. Each first transistor 11 includes a first gate 111, a first source 112 and a first drain 113.

For example, each sub-pixel region P may be provided with a first transistor 11 therein. As shown in FIG. 2, sub-pixel regions P arranged in a line in the first direction X may be referred to as sub-pixel regions P in a same column, and sub-pixel regions P arranged in a line in the second direction Y may be referred to as sub-pixel regions P in a same row. For example, first transistors 11 in the sub-pixel regions P in the same row may be electrically connected to a gate line GL, and first transistors 11 in the sub-pixel regions P in the same column may be electrically connected to a data line DL. Each first transistor 11 may be electrically connected to a corresponding gate line GL through the first gate 111, and to a corresponding data line DL through one of the first source 112 and the first drain 113 (e.g., the first source 112).

Of course, the first transistors 11 in the sub-pixel regions P in the same row may also be electrically connected to a plurality of gate lines GL, which is not limited in the embodiments of the present disclosure.

In some examples, as shown in FIGS. 3 to 11, the array substrate 100 further includes a plurality of conductive pins 12 disposed on the side of the base 10 and located in the bonding area B. Every two adjacent conductive pins 12 have a gap therebetween. In this way, it is possible to ensure that every two adjacent conductive pins 12 are in an insulated state, thereby avoiding a short circuit between every two adjacent conductive pins 12.

Figure 3:
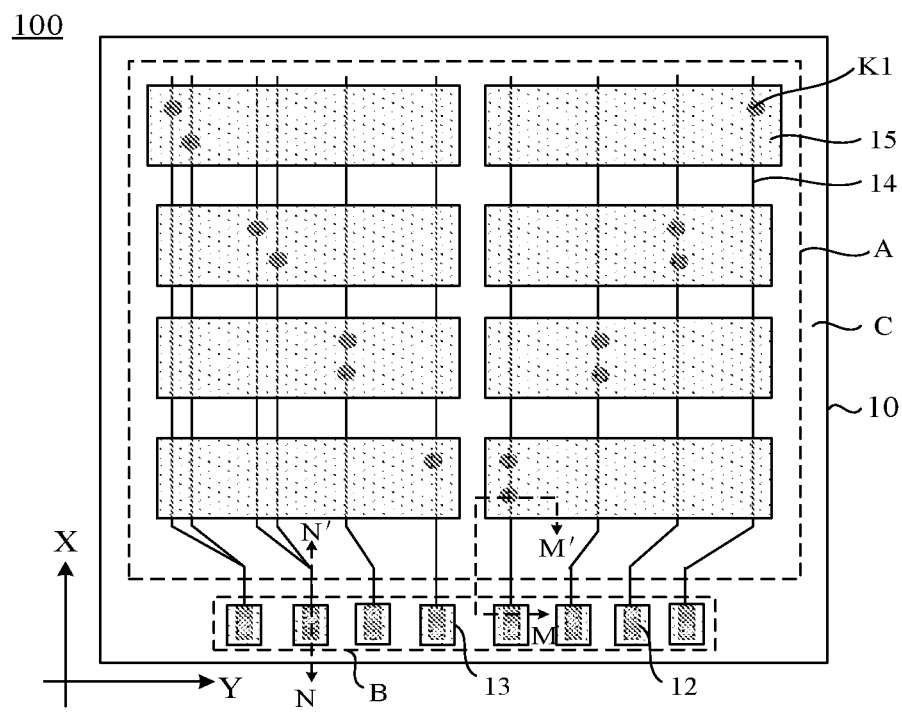
FIG. 3 is a structural diagram of another array substrate, in accordance with some embodiments of the present disclosure.
Figure 4:
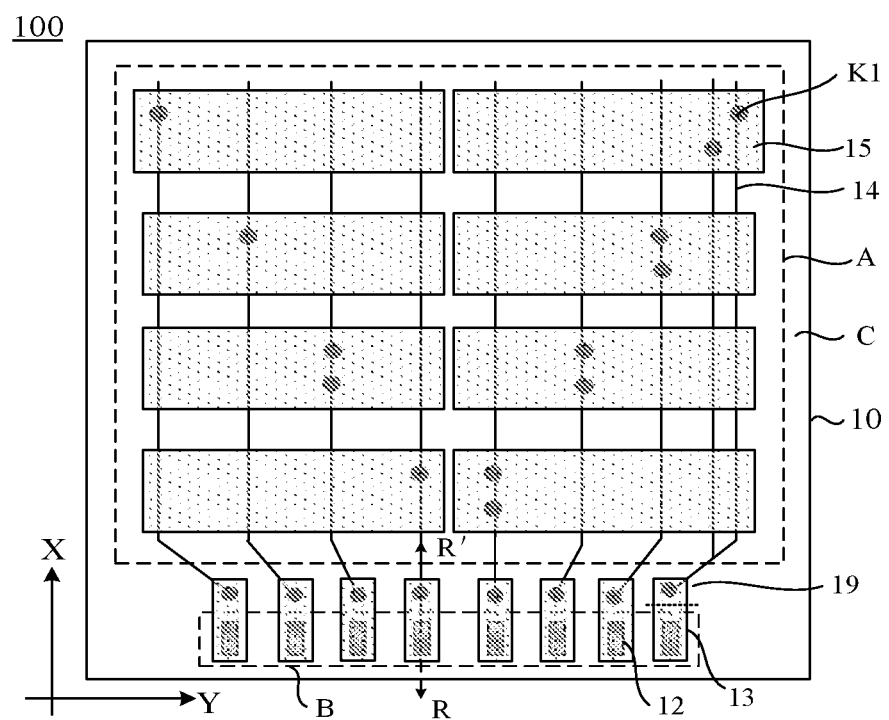
FIG. 4 is a structural diagram of yet another array substrate, in accordance with some embodiments of the present disclosure.
Figure 5:
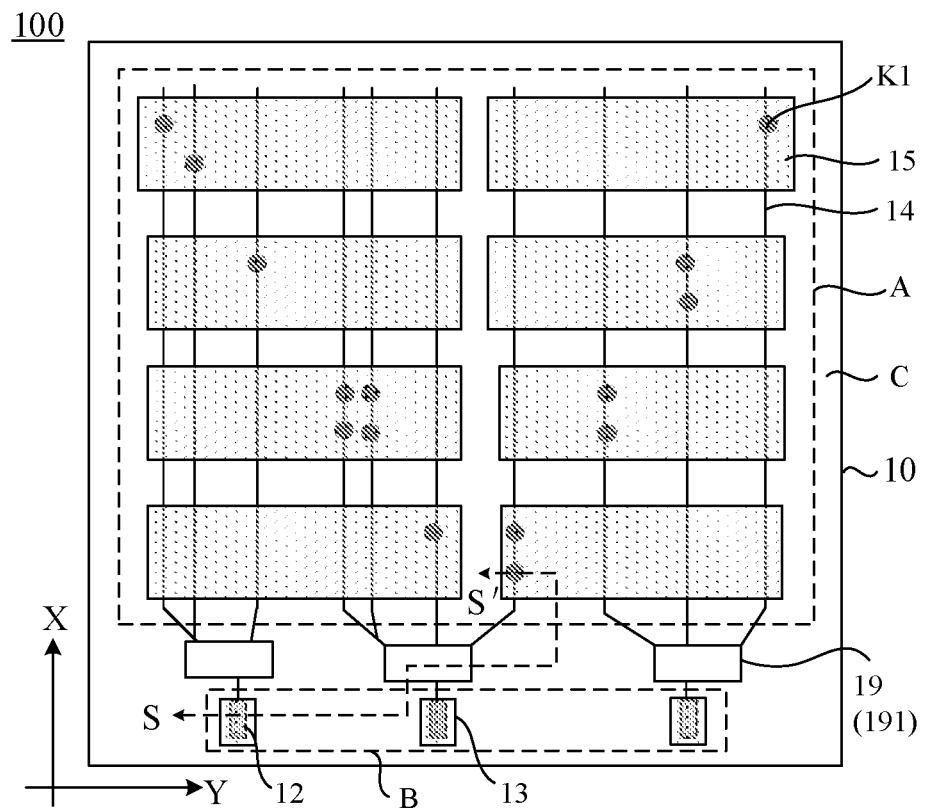
FIG. 5 is a structural diagram of yet another array substrate, in accordance with some embodiments of the present disclosure.

Here, as shown in FIGS. 3 to 5, each conductive pin 12 may be, for example, in a strip shape and extend in the first direction X.

As shown in FIGS. 6, 7, 10, and 11, the plurality of conductive pins 12 may be disposed in a same layer as the first gate 111. In this way, the plurality of conductive pins 12 may have good electrical properties. The first gate 111 is disposed in the same layer as the gate lines GL, which means that the conductive pins 12, the first gate 111 and the gate lines GL may be disposed in the same layer.

It will be noted that the "same layer" herein refers to that a film layer for forming specific patterns is formed by using a same film-forming process, and then a patterning process is performed on the film layer by using a same mask to form a layer structure. Depending on different specific patterns, the patterning process may include several exposure, development and etching processes. The specific patterns in the formed layer structure may be continuous or discontinuous, and these specific patterns may also be at different heights or have different thicknesses. In this way, the conductive pins 12, the first gate 111, and the gate lines GL may be manufactured simultaneously, which is beneficial to simplifying a manufacturing process of the array substrate 100.

In addition, the first source 112, the first drain 113, and the data lines DL may also be disposed in a same layer. In this way, the first source 112, the first drain 113, and the data lines DL may be manufactured simultaneously in a single patterning process, which is beneficial to simplifying the manufacturing process of the array substrate 100.

In some examples, as shown in FIG. 2, at least one data line DL is electrically connected to one conductive pin 12. In this way, a data voltage may be transmitted to the data line DL using the conductive pin 12, and further transmitted to a first transistor 11 electrically connected to the data line DL, so that the array substrate 100 operates.

Here, a relationship between the data lines DL and the conductive pins 12 includes various types, which may be selectively set according to actual needs.

For example, as shown in FIG. 2, the data lines DL may be electrically connected to the conductive pins 12 in one-to-one correspondence. In this way, the conductive pins 12 are used to transmit data voltages to the data lines DL separately, so as to avoid crosstalk during the transmission of the data voltages.

For another example, multiple data lines DL may be electrically connected to one conductive pin 12. For example, the conductive pin 12 may be electrically connected to two, three, or four data lines DL. In this case, the data voltages may be transmitted to the data lines DL at different time. In this way, it is possible to reduce the number of the conductive pins 12, increase a distance between two adjacent conductive pins 12, and avoid a short circuit between two adjacent conductive pins 12.

In some examples, as shown in FIGS. 3 to 11, the array substrate 100 further includes a plurality of conductive electrodes 13 each disposed on a respective one of surfaces of the plurality of conductive pins 12 away from the base 10.

Here, a positional relationship between the plurality of conductive pins 12 and the plurality of conductive electrodes 13 may be that, for example, the plurality of conductive pins 12 are in one-to-one correspondence with the plurality of conductive electrodes 13. That is, a surface of each conductive pin 12 away from the base 10 may be provided with a conductive electrode 13.

The conductive electrode 13 is disposed on the surface of the conductive pin 12 away from the base 10. That is, a surface of the conductive electrode 13 proximate to the base 10 is in direct contact with a surface of a corresponding conductive pin 12 away from the base 10 without other films disposed therebetween.

It will be noted that the sentence "A is disposed (or located) on a side of B away from C" mentioned herein not only refers to a positional relationship of A, B and C in space, but also means that A is formed after B.

Hereinafter, a layer where the conductive pins 12, first gates 111, and the gate lines GL are located may be referred to as a gate conductive layer, a layer where first sources 112, first drains 113, and the data lines DL are located may be referred to as a source-drain conductive layer, and a layer where the conductive electrodes 13 are located may be referred to as an electrode layer.

In some examples, the first sources 112 and the first drains 113 are disposed on a side of the first gates 111 away from the base 10. That is, the source-drain conductive layer is formed after the gate conductive layer.

In some examples, the conductive electrodes 13 are disposed on a side of the first sources 112 and the first drains 113 away from the base 10. That is, the electrode layer is formed after the source-drain conductive layer.

The surface of the conductive electrode 13 proximate to the base 10 is in direct contact with the surface of the corresponding conductive pin 12 away from the base 10, which means that in a process of manufacturing the source-drain conductive layer, portions, of a film used to form the source-drain conductive layer, covering the conductive pins 12 are removed, so that an orthogonal projection of the source-drain conductive layer on the base 10 does not overlap with orthogonal projections of the conductive pins 12 on the base 10. This may also avoid corrosion of the source-drain conductive layer in a subsequent process of manufacturing the array substrate 100.

Therefore, in the array substrate 100 provided by some embodiments of the present disclosure, the conductive pins 12 in the bonding area B are disposed in the same layer as the first gates 111 of the first transistors 11, the conductive electrodes 13 are each disposed directly on the surface of the conductive pin 12 away from the base 10, and the portions, of the film used to form the source-drain conductive layer, covering the conductive pins 12 are not reserved. In this way, in the process of manufacturing the array substrate 100, the corrosion of the source-drain conductive layer may be avoided, and the twill defect of the tear film may be prevented from occurring on a display apparatus to which the array substrate 100 is applied, thereby effectively improving a display effect of the display apparatus.

In some embodiments, as shown in FIGS. 3 to 5, the orthogonal projections of the plurality of conductive pins 12 on the base 10 are each within an orthogonal projection of a respective one of the plurality of conductive electrodes 13 on the base 10. For example, an orthogonal projection of each conductive pin 12 on the base 10 is within an orthogonal projection of a corresponding conductive electrode 13 on the base 10. Each conductive electrode 13 covers a corresponding conductive pin 12.

In this way, the conductive electrode 13 may be used to form an anti-etching protection for the corresponding conductive pin 12, which may avoid an influence on a shape of the conductive pin 12 in the process of manufacturing the array substrate 100.

Here, every two adjacent conductive electrodes 13 have a gap therebetween. In this way, it is possible to ensure that every two adjacent conductive electrodes 13 are in an insulated state, avoid a short circuit formed between every two adjacent conductive electrodes 13, and in turn avoid the short circuit formed between the conductive pins 12 covered by the conductive electrodes 13.

In some embodiments, as shown in FIGS. 3 to 11, the array substrate 100 further includes a plurality of touch signal lines 14 disposed on the side of the base 10.

In some examples, as shown in FIGS. 6, 7, 10, and 11, the plurality of touch signal lines 14 are disposed in a same layer as the first sources 112, the first drains 113 and the plurality of data lines DL. In this way, the touch signal lines 14, the first sources 112, the first drains 113, and the data lines DL may be manufactured simultaneously in a single patterning process, which is beneficial to simplifying the manufacturing process of the array substrate 100. In addition, it is also possible to prevent corrosion of the plurality of touch signal lines 14, and in turn prevent the twill defect of the tear film from occurring on the display apparatus to which the array substrate 100 is applied, which may effectively improving the display effect of the display apparatus.

In some examples, as shown in FIGS. 3 to 5, the plurality of touch signal lines 14 extend in the first direction X. That is, an extending direction of the plurality of touch signal lines 14 is the same or substantially the same as an extending direction of the plurality of data lines DL. In this way, it is convenient to arrange and avoid patterns included in the array substrate 100, thereby avoiding a case where a touch signal line 14 and a data line DL intersect and thus a short circuit occurs.

In some examples, as shown in FIGS. 3 to 5, touch signal line(s) 14 are electrically connected to a conductive pin 12. In this way, a signal in the conductive pin 12 may be transmitted to the corresponding touch signal line(s) 14, or a signal in a touch signal line 14 may be transmitted to a corresponding conductive pin 12.

Here, a connection relationship between the conductive pins 12 and the touch signal lines 14 includes various types, which may be selectively set according to actual needs. For example, at least one touch signal line 14 is electrically connected to one conductive pin 12.

For example, the touch signal lines 14 and the conductive pins 12 may be in one-to-one correspondence. That is, each touch signal line 14 may be electrically connected to a conductive pin 12. In this way, the conductive pins 12 are used to transmit signals to the touch signal lines 14 separately, so as to avoid crosstalk during the signal transmission.

For another example, multiple touch signal lines 14 may be electrically connected to one conductive pin 12. For example, the conductive pin 12 is electrically connected to two touch signal lines 14; alternatively, the conductive pin 12 is electrically connected to three touch signal lines 14; alternatively, the conductive pin 12 is electrically connected to six touch signal lines 14. In this way, it is possible to reduce the number of the conductive pins 12, increase the distance between two adjacent conductive pins 12, and avoid the short circuit between two adjacent conductive pins 12.

In some examples, the conductive pin 12 electrically connected to the touch signal line(s) 14 and the conductive pin 12 electrically connected to data line(s) DL are not the same conductive pin 12. That is, in a case where the conductive pin 12 is electrically connected to the touch signal line(s) 14, the conductive pin 12 is only electrically connected to the touch signal line(s) 14; and in a case where the conductive pin 12 is electrically connected to the data line(s) DL, the conductive pin 12 is only electrically connected to the data line(s) DL.

It will be noted that in some examples of the present disclosure, the array substrate 100 is further provided with other signal lines (e.g., common electrode lines) therein. In this case, the plurality of conductive pins 12 may further include conductive pins 12 electrically connected to the common electrode lines or the gate lines GL.

In some embodiments, as shown in FIGS. 3 to 5, the array substrate 100 further includes a plurality of touch electrodes 15 disposed on a side of the plurality of touch signal lines 14 away from the base 10. The plurality of touch electrodes 15 are disposed in a same layer and are independent of each other.

In some examples, as shown in FIGS. 3 to 5, each touch electrode 15 is electrically connected to at least one touch signal line 14. In this case, the at least one touch signal line 14 may be used to input a signal (e.g., a touch detection signal) to the touch electrode 15 or output a signal (e.g., a capacitance value signal) from the touch electrode 15.

In some examples, the array substrate 100 provided by some embodiments of the present disclosure may be applied to a display apparatus in a self-capacitance mode. In this way, in a case where a human body does not touch the display apparatus, capacitance provided by each touch electrode 15 is fixed capacitance; and in a case where a human body touches the display apparatus, capacitance provided by a touch electrode 15 corresponding to a position touched by the human body is the fixed capacitance superimposed human body capacitance. Capacitance of the touch electrodes 15 may be transmitted through the conductive pins 12 and the touch signal lines 14, and changes of the capacitance of the touch electrodes 15 are detected, so as to determine the position that the human body touches.

Here, a relationship between the touch electrodes 15 and the touch signal lines 14 includes various types, which may be selectively set according to actual needs.

For example, as shown in FIGS. 3 to 5, the plurality of touch electrodes 15 and the plurality of touch signal lines 14 may be electrically connected in one-to-one correspondence. In this way, the number of the touch signal lines 14 may be reduced, which is beneficial to reducing a space occupancy ratio of the touch signal lines 14 in the array substrate 100. In addition, each touch signal line 14 may be used to separately transmit capacitance provided by a corresponding touch electrode 15, which may avoid crosstalk of the capacitance during the transmission process, avoid an error in determination of the position touched by the human body, and in turn ensure an accuracy of determining the position touched by the human body.

For another example, as shown in FIGS. 3 and 5, each touch electrode 15 may be electrically connected to multiple touch signal lines 14. For example, as shown in FIGS. 3 and 5, each touch electrode 15 may be electrically connected to two touch signal lines 14. In this way, in a case where a connection between the touch electrode 15 and one of the touch signal lines 14 is abnormal, another touch signal line 14 may be used to perform signal transmission with the touch electrode 15, which is beneficial to improving reliability of an electrical connection between the touch electrode 15 and the touch signal lines 14 and reliability of signal transmission between the touch electrode 15 and the touch signal lines 14.

The touch electrode 15 may be made of various materials, which may be selectively set according to actual needs. For example, a material of the touch electrode 15 may be a conductive material with a high light transmittance. The conductive material may be, for example, indium tin oxide (ITO) or indium gallium zinc oxide (IGZO).

Here, it will be noted that at least one touch signal line 14 electrically connected to one conductive pin 12 and at least one touch signal line 14 electrically connected to one touch electrode 15 may be the same or different. For example, as shown in FIG. 5, a part of the multiple touch signal lines 14 electrically connected to one conductive pin 12 are electrically connected to different touch electrodes 15.

In some embodiments, as shown in FIGS. 6, 7, 10, and 11, the array substrate 100 further includes a planarization layer 16 disposed between the plurality of first transistors 11 and the plurality of touch electrodes 15. That is, the planarization layer 16 is disposed between the source-drain conductive layer and the plurality of touch electrodes 15.

By providing the planarization layer 16, the plurality of touch electrodes 15 disposed on a side of the planarization layer 16 away from the base 10 may have a relatively flat shape, and unevenness may be prevented from appearing on the plurality of touch electrodes 15.

In some examples, as shown in FIGS. 6, 7, 10, and 11, the planarization layer 16 has a plurality of first via holes K1, and each touch signal line 14 is electrically connected to a touch electrode 15 through at least one first via hole K1.

Here, the plurality of first via holes K1 expose the surfaces of the plurality of touch signal lines 14 away from the base 10.

For example, the plurality of first via holes K1 are in one-to-one correspondence with the plurality of touch signal lines 14. In this case, each touch signal line 14 may be electrically connected to the touch electrode 15 through a single first via hole K1. In this way, the number of the first via holes K1 formed by etching may be reduced, and a process difficulty of forming the planarization layer 16 may be reduced.

For example, each touch signal line 14 corresponds to multiple first via holes K1. In this case, each touch signal line 14 may be electrically connected to the touch electrode 15 through the multiple first via holes K1. In this way, a contact area between each touch electrode 15 and a corresponding touch signal line 14 may increase, and a good electrical connection between each touch electrode 15 and the corresponding touch signal line 14 may be ensured.

In some examples, as shown in FIGS. 6, 7, 10, and 11, an orthogonal projection of the planarization layer 16 on the base 10 does not overlap with the orthogonal projections of the plurality of conductive pins 12 on the base 10. For example, the orthogonal projection of the planarization layer 16 on the base 10 does not overlap with a border of the bonding area B. That is, the planarization layer 16 does not cover the conductive electrodes 13 on the surfaces of the conductive pins 12 away from the base 10.

Since the planarization layer 16 has a good insulation property, by setting a positional relationship between the planarization layer 16 and the plurality of conductive pins 12, the planarization layer 16 may be prevented from adversely affecting the electrical connection between the conductive electrodes 13 and other structures (e.g., a chip on film, also referred to as a chip on flex, abbreviated as COF). Here, for the chip on film, reference may be made to the description in some embodiments below.

Figure 7:
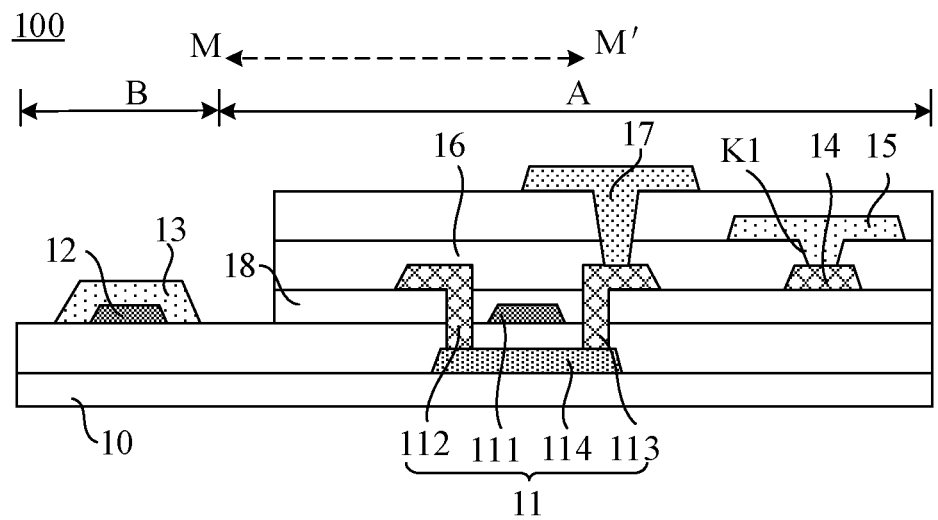
FIG. 7 is another sectional view of the array substrate shown in FIG. 3 taken along the M-M' direction.
Figure 11:
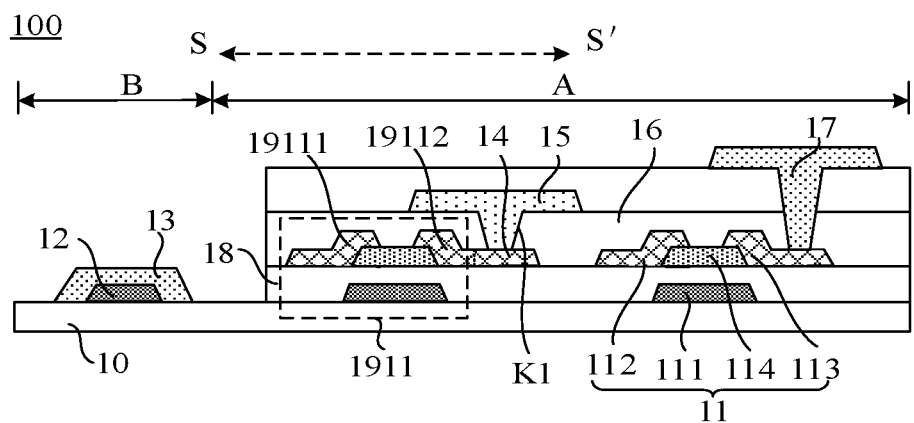
FIG. 11 is another sectional view of the array substrate shown in FIG. 5 taken along the S-S' direction.

In some embodiments, as shown in FIGS. 7 and 11, the array substrate 100 further includes a plurality of pixel electrodes 17.

In some examples, as shown in FIGS. 7 and 11, the plurality of pixel electrodes 17 may be disposed on a side of the plurality of touch electrodes 15 away from the base 10. Of course, the plurality of pixel electrodes 17 may also be disposed on a side of the plurality of touch electrodes 15 proximate to the base 10, which is not limited in the embodiments of the present disclosure.

Here, as shown in FIG. 2, in a case where each first transistor 11 is electrically connected to a corresponding data line DL through the first source 112 of the first transistor 11, each pixel electrode 17 may be electrically connected to the first drain 113 of the first transistor 11. In a case where each first transistor 11 is electrically connected to the corresponding data line DL through the first drain 113 of the first transistor 11, each pixel electrode 17 is electrically connected to the first source 112 of the first transistor 11.

As shown in FIG. 2, in an example in which each first transistor 11 is electrically connected to the corresponding data line DL through the first source 112 of the first transistor 11 and each pixel electrode 17 may be electrically connected to the first drain 113 of the first transistor 11, during an operation of the array substrate 100, a control signal (e.g., a control signal for controlling the first transistor 11 to be turned on) may be transmitted to the first gate 111 of the first transistor 11 by the gate line GL, so as to control the first transistor 11 to be turned on; and then, a data voltage is transmitted, by the data line GL, to the pixel electrode 17, through the first source 112 and the first drain 113 of the first transistor 11 in sequence, so as to charge the pixel electrode 17.

The pixel electrode 17 is made of various materials, which may be selectively set according to actual needs. For example, a material of the pixel electrode 17 may be a conductive material with the high light transmittance. The conductive material may be, for example, ITO or IGZO.

In some examples, as shown in FIGS. 6, 7, 10, and 11, the plurality of conductive electrodes 13 may be disposed in a same layer as the plurality of touch electrodes 15 or the plurality of pixel electrodes 17. In this way, in a single patterning process, the plurality of conductive electrodes 13 and the plurality of touch electrodes 15 may be manufactured and formed simultaneously, or the plurality of conductive electrodes 13 and the plurality of pixel electrodes 17 may be manufactured and formed simultaneously, which is beneficial to simplifying the manufacturing process of the array substrate 100.

By providing the plurality of conductive electrodes 13 in the same layer as the plurality of touch electrodes 15 or as the plurality of pixel electrodes 17, it is possible to avoid an additional patterning process, lower a complexity of manufacturing the array substrate 100, and reduce the amount of materials used, thereby reducing production costs of the array substrate 100.

In some examples, the plurality of touch electrodes 15 in some embodiments as above are further used as common electrodes. In this way, in a case where the display apparatus to which the array substrate 100 is applied displays an image and no touch detection is performed, a common voltage may be transmitted to the plurality of touch electrodes 15, and electric fields may be generated between the plurality of touch electrodes 15 and the plurality of pixel electrodes 17. The electric fields can drive liquid crystal molecules in the display apparatus to deflect, so that the display apparatus achieves display of the image.

In the embodiments of the present disclosure, when the display apparatus displays the image, the common voltage may be transmitted to the touch electrodes 15 through the conductive pins 12 and the touch signal lines 14; and when the display apparatus performs touch detection, the capacitance provided by the touch electrode 15 may be transmitted through the touch signal line 14 and the conductive pin 12. Therefore, a relatively good electrical connection is required between the conductive pin 12 and the corresponding at least one touch signal line 14.

Here, the conductive pin 12 and the corresponding at least one touch signal line 14 may have various connection manners, which may be selectively set according to actual needs.

In some embodiments, the conductive pin 12 and the corresponding at least one touch signal line 14 may be directly electrically connected. In this case, as shown in FIG. 3, the at least one touch signal line 14 may be electrically connected to a same touch electrode 15.

In some examples, as shown in FIGS. 6, 7, 10, and 11, the array substrate 100 further includes an insulating layer 18 disposed between a layer (i.e., the source-drain conductive layer) where the first sources 112 and the first drains 113 are located and the first gates 111. The insulating layer 18 is configured to insulate the layer where the first sources 112 and the first drains 113 are located and the first gates 111, so as to avoid the short circuit.

Here, the insulating layer 18 may be of various types, and the type thereof is related to a structure of the first transistor 11.

For example, as shown in FIGS. 6, 7, 10, and 11, each first transistor 11 further includes a first active layer 114.

Figure 6:
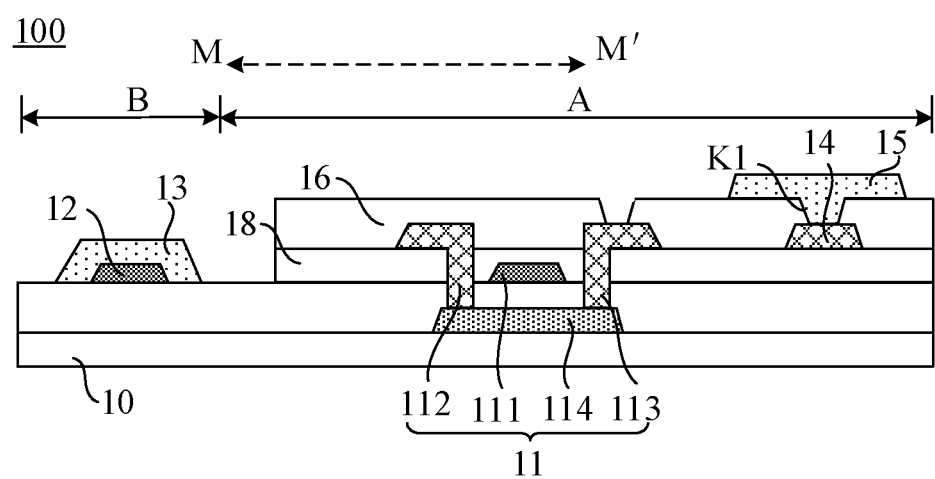
FIG. 6 is a sectional view of the array substrate shown in FIG. 3 taken along the M-M' direction.

For example, as shown in FIGS. 6 and 7, the first active layer 114 is disposed on a side of the first gate 111 proximate to the base 10. In this case, the structure of the first transistor 11 is a top-gate structure. The insulating layer 18 may be referred to as an interlayer dielectric layer, and the insulating layer 18 may be formed by stacking a silicon nitride film and a silicon dioxide film.

Figure 10:
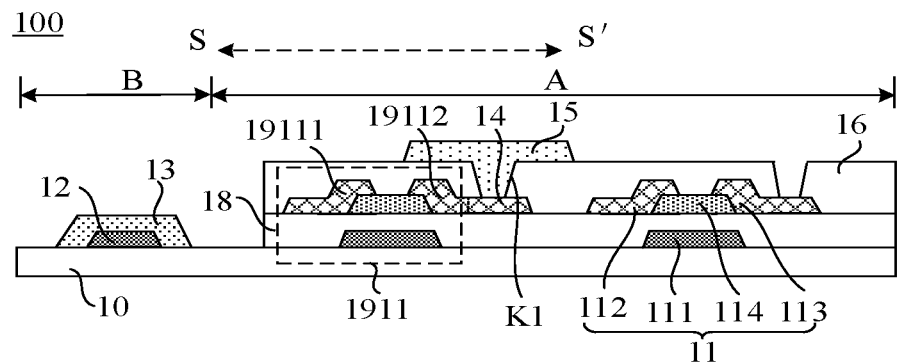
FIG. 10 is a sectional view of the array substrate shown in FIG. 5 taken along the S-S' direction.

For another example, as shown in FIGS. 10 and 11, the first active layer 114 is disposed on a side of the first gate 111 away from the base 10. In this case, the structure of the first transistor 11 is a bottom-gate structure. The insulating layer 18 may be referred to as a gate insulating layer, and the insulating layer 18 may be made of a material such as silicon oxide, silicon nitride, or silicon oxynitride.

Figure 8:
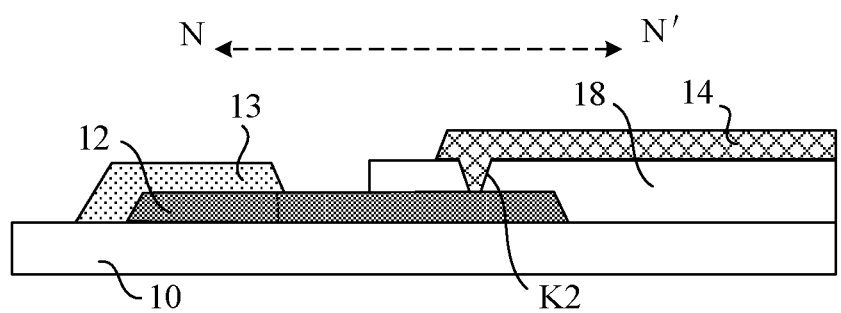
FIG. 8 is a sectional view of the array substrate shown in FIG. 3 taken along the N-N' direction.

In some examples, as shown in FIG. 8, the insulating layer 18 is provided with a plurality of second via holes K2 therein, and each touch signal line 14 is electrically connected to a conductive pin 12 through at least one second via hole K2.

In this case, the plurality of conductive pins 12 are led out of the bonding area B, and the plurality of second via holes K2 expose the surfaces of portions, that are led out of the bonding area B, of the conductive pins away from the base 10. Each touch signal line 14 is in direct contact with a surface of the conductive pin 12 through the at least one second via hole K2 to form an electrical connection. This is beneficial to simplifying a structure of the array substrate 100.

Based on this, as shown in FIG. 8, the conductive electrode 13 covers a portion of the conductive pin 12 located in the bonding area B, and does not cover a portion of the conductive pin 12 that are led out of the bonding area B.

In some examples, as shown in FIGS. 6, 7, 10, and 11, an orthogonal projection of the insulating layer 18 on the base 10 does not overlap with the orthogonal projections of the plurality of conductive pins 12 on the base 10. That is, the insulating layer 18 does not cover the surfaces of the conductive pins 12 away from the base 10. For example, the orthogonal projection of the insulating layer 18 on the base 10 does not overlap with the border of the bonding area B.

Since the insulating layer 18 has a good insulation property, by setting a positional relationship between the insulating layer 18 and the plurality of conductive pins 12, it is possible to prevent the insulating layer 18 from adversely affecting the electrical connection between the conductive pins 12 and other structures (e.g., the conductive electrodes 13).

In some other embodiments, the conductive pin 12 is indirectly electrically connected to the corresponding at least one touch signal line 14.

For example, as shown in FIGS. 4 and 5, the array substrate 100 further includes a plurality of connection portions 19. At least one touch signal line 14 is electrically connected to one conductive pin 12 through a connection portion 19. That is, one end of the connection portion 19 is electrically connected to the conductive pin 12, and another end of the connection portion 19 is electrically connected to the at least one touch signal line 14. A connection relationship between the connection portion 19 and the at least one touch signal line 14 may be that: the connection portion 19 may be electrically connected to one touch signal line 14, alternatively, the connection portion 19 may be electrically connected to two or more touch signal line 14.

Here, the connection portion 19 includes a variety of structures, which may be selectively set according to actual needs.

Figure 9:
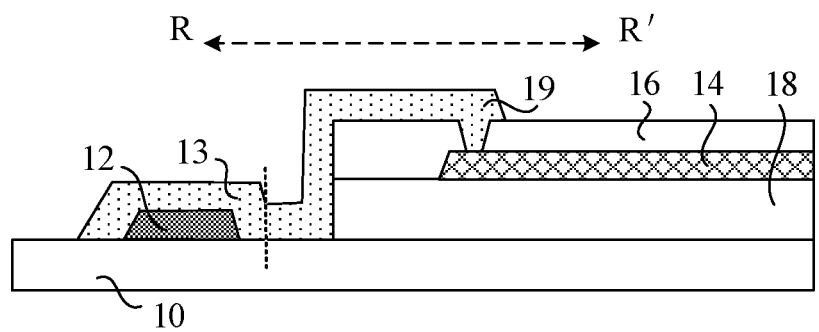
FIG. 9 is a sectional view of the array substrate shown in FIG. 4 taken along the R-R' direction.

In some examples, as shown in FIG. 9, in a case where the array substrate 100 includes the plurality of touch electrodes 15, the plurality of connection portions 19 may be disposed in a same layer as the plurality of touch electrodes 15. Alternatively, in a case where the array substrate 100 includes the plurality of pixel electrodes 17, the plurality of connection portions 19 may be disposed in a same layer as the plurality of pixel electrodes 17. In this case, each connection portion 19 is a conductive pattern disposed in the same layer and made of a same material as the touch electrode 15 or as the pixel electrode 17.

In this case, each of the plurality of connection portions 19 and a respective one of the plurality of conductive electrodes 13 may be of an integrated structure, and an end of the connection portion 19 may be electrically connected to at least one touch signal line 14 through via holes.

Based on this, as shown in FIG. 4, the at least one touch signal line 14 may be electrically connected to a same touch electrode 15.

In this example, the connection portions 19 are provided in the same layer as the touch electrodes 15 or the pixel electrodes 17. In this way, in a single patterning process, the connection portions 19 and the touch electrodes 15 may be manufactured and formed simultaneously, or the connection portions 19 and the pixel electrodes 17 may be manufactured and formed simultaneously, which is beneficial to simplifying the manufacturing process of the array substrate 100.

Figure 12:
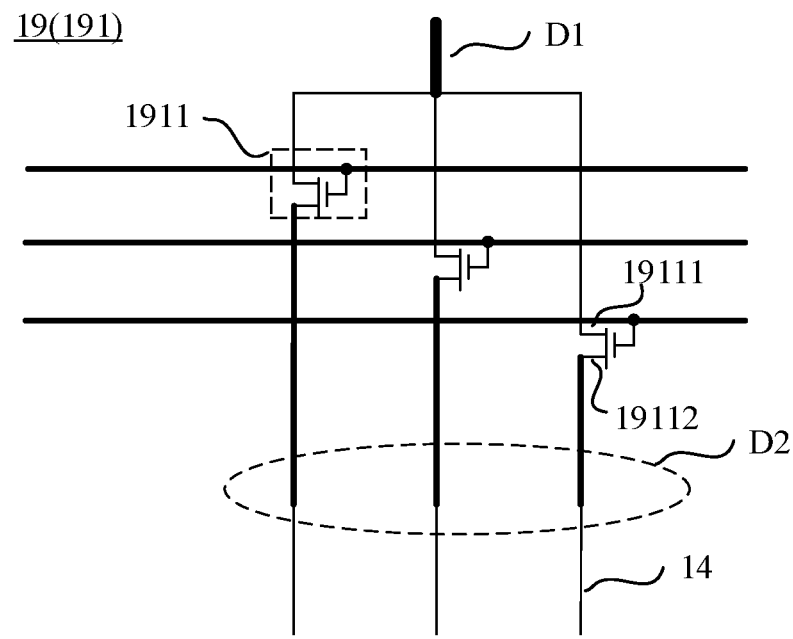
FIG. 12 is an equivalent circuit diagram of a connection portion of the array substrate shown in FIG. 5.

In some other examples, as shown in FIG. 12, the connection portion 19 includes a multiplexer 191 (MUX). The multiplexer 191 includes an input end D1 and output ends D2, the input end D1 is electrically connected to one conductive pin 12, and the output ends D2 are electrically connected to at least two touch signal lines 14. For example, the output ends D2 may be electrically connected to two, three or four touch signal lines 14.

By electrically connecting the input end D1 of each multiplexer 191 with one conductive pin 12, and the output ends D2 thereof with at least two touch signal lines 14, the number of conductive pins 12 may be reduced, in turn a distance between two adjacent conductive pins 12 may increase, and the short circuit between the two adjacent conductive pins 12 may be avoided.

A structure of the multiplexer 191 includes, for example, at least two second transistors 1911. Each second transistor 1911 includes a second source 19111 and a second drain 19112.

Here, as shown in FIGS. 10 and 11, one (e.g., the second source 19111) of the second source 19111 and the second drain 19112 may be used as the input end D1 to be electrically connected to the conductive pin 12, and the other one (e.g., the second drain 19112) of the second source 19111 and the second drain 19112 may be used as an output end D2 to be electrically connected to one of the at least two touch signal lines 14.

In this way, in a case where the display apparatus to which the array substrate 100 is applied displays the image, the common voltage may be transmitted to the conductive pins 12, and further be transmitted to corresponding touch signal lines 14 and corresponding touch electrodes 15 through the multiplexer 191. The corresponding touch signal lines 14 may be a part of the at least two touch signal lines 14 connected to the multiplexer 191.

In this case, as shown in FIG. 5, the at least one touch signal line 14 may be electrically connected to the same touch electrode 15 or different touch electrodes 15.

In addition, it will be noted that at least one data line DL and one conductive pin 12 may also be electrically connected through the connection portion 19. For the connection between the at least one data line DL and the one conductive pin 12, reference may be made to the description of the connection between at least one touch signal line 14 and one conductive pin 12 in some embodiments as above, and details will not be repeated here.

Figure 13:
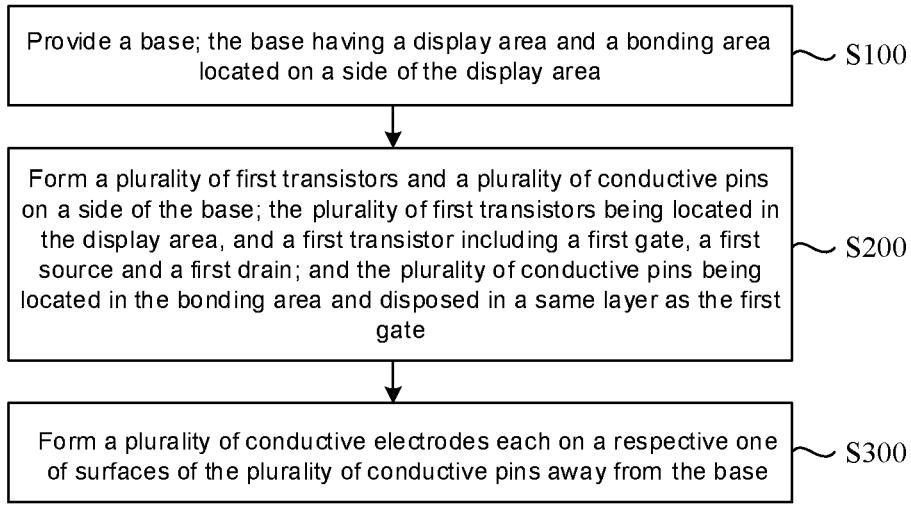
FIG. 13 is a flowchart of a method for manufacturing an array substrate, in accordance with some embodiments of the present disclosure.

Some embodiments of the present disclosure provide a method for manufacturing an array substrate. As shown in FIG. 13, the method for manufacturing the array substrate includes steps 100 to 300 (S100 to S300).

Figure 16:
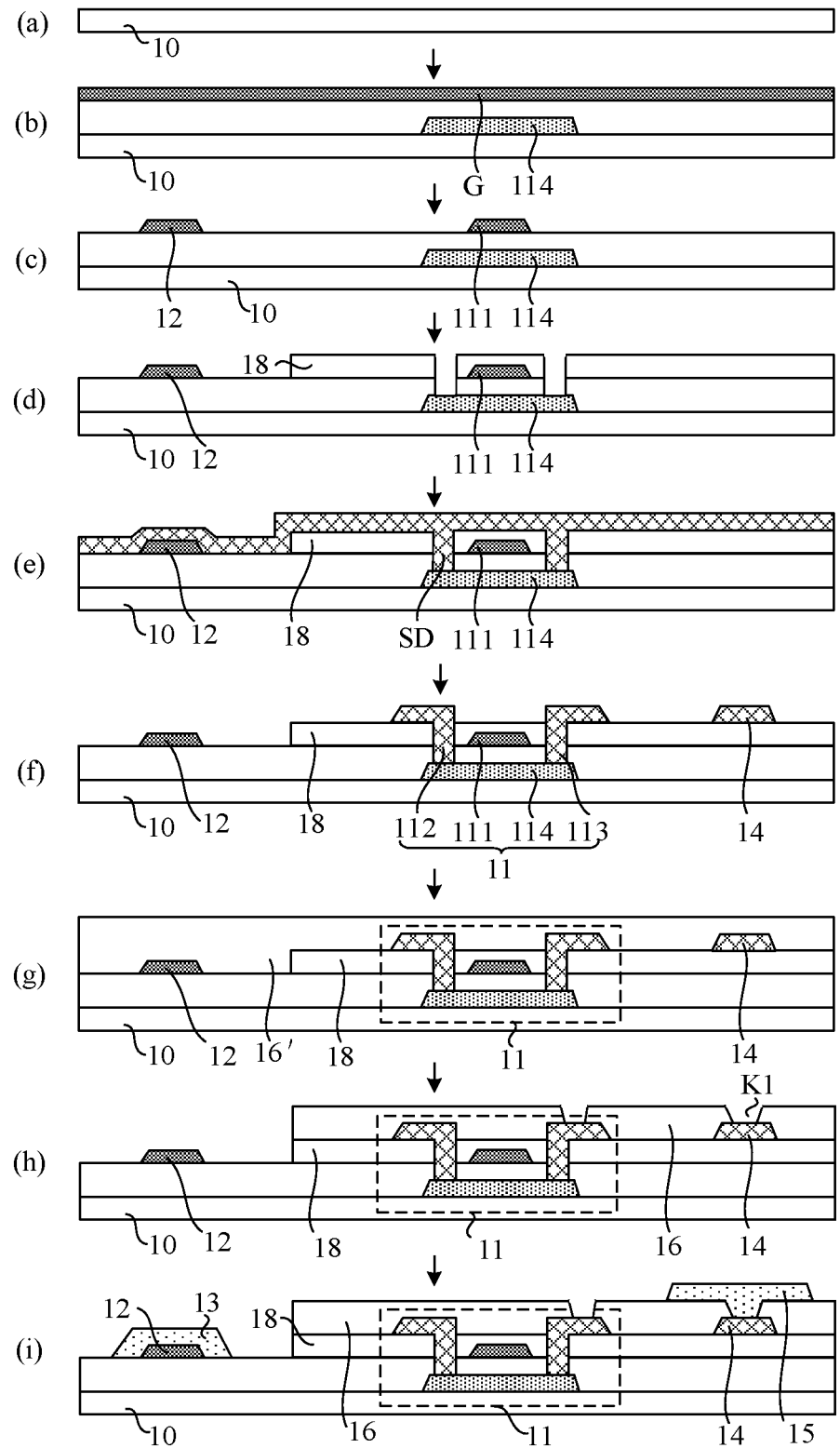
FIG. 16 is a diagram showing a process of manufacturing an array substrate, in accordance with some embodiments of the present disclosure.

In S100, as shown in (a) in FIG. 16, a base 10 is provided. The base 10 has a display area A and a bonding area B located on a side of the display area A.

In some examples, fora structure of the base 10, reference may be made to the description of the structure of the base 10 in some embodiments as above, and details will not be repeated here.

In S200, as shown in (f) in FIG. 16, a plurality of first transistors 11 and a plurality of conductive pins 12 are formed on a side of the base 10. The plurality of first transistors 11 are located in the display area A, and a first transistor 11 includes a first gate 111, a first source 112 and a first drain 113. The plurality of conductive pins 12 are located in the bonding area B and are disposed in a same layer as the first gates 111.

Figure 14:
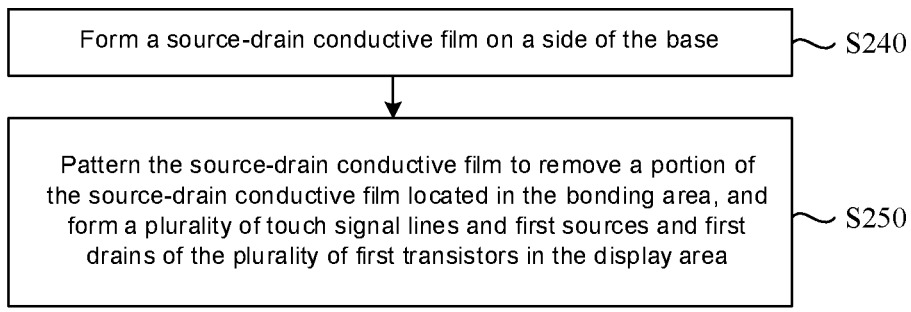
FIG. 14 is a flowchart of S200 in the flowchart shown in FIG. 13.

In some examples, as shown in FIG. 14, the step of forming the plurality of first transistors 11 and the plurality of conductive pins 12 in S200 includes steps 210 to 250 (S210 to S250).

In S210, as shown in (b) in FIG. 16, a gate conductive film G is formed on the side of the base 10.

For example, the gate conductive film G may be formed by using a magnetron sputtering process. A material of the gate conductive film G may be, for example, a metal material with a relatively small resistance such as aluminum (Al), copper (Cu), molybdenum (Mo), titanium (Ti), or aluminum neodymium alloy (AlNd).

In S220, as shown in (c) in FIG. 16, the gate conductive film G is patterned to form the first gates 111 of the plurality of first transistors 11 in the display area A and the plurality of conductive pins 12 in the bonding area B, so as to form a gate conductive layer.

For example, the gate conductive film G may be patterned through a photolithography process and a wet etching process.

In S230, as shown in (d) in FIG. 16, an insulating layer 18 is formed on a side of the gate conductive layer away from the base 10.

For example, the insulating layer 18 may be formed by using a photolithography process.

Here, for a structure and material of the insulating layer 18, reference may be made to the description of the structure and material of the insulating layer 18 in some embodiments as above, and details will not be repeated here.

In S240, as shown in (e) in FIG. 16, a source-drain conductive film SD is formed on the side (i.e., a side of the insulating layer 18 away from the base 10) of the base 10.

For example, the source-drain conductive film SD may be formed by using a magnetron sputtering process.

Here, a method for forming the source-drain conductive film SD may be that, for example, a first titanium metal film is formed on the side of the insulating layer 18 away from the base 10, then an aluminum metal film is formed on a side of the first titanium metal film away from the base 10, and then a second titanium metal film is formed on a side of the aluminum metal film away from the base 10, so as to obtain the source-drain conductive film SD.

In S250, as shown in (f) in FIG. 16, the source-drain conductive film SD is patterned to remove a portion of the source-drain conductive film SD located in the bonding area B, and form a plurality of touch signal lines 14 and first sources 112 and first drains 113 of the plurality of first transistors 11 in the display area A, so as to obtain a source-drain conductive layer.

For example, the source-drain conductive film SD may be patterned by using a photolithography process and a wet etching process.

By removing the portion of the source-drain conductive film SD located in the bonding area B, it is possible to prevent the source-drain conductive layer from corrosion in the subsequent process of manufacturing and forming the array substrate 100, thereby avoiding the appearance of a twill defect of a tear film on a display apparatus to which the array substrate 100 is applied, which may effectively improving a display effect of the display apparatus.

In S300, as shown in (i) in FIG. 16, a plurality of conductive electrodes 13 are each formed on a respective one of surfaces of the plurality of conductive pins 12 away from the base 10.

In some examples, forming the plurality of conductive electrodes 13 in S300 includes steps 310 and 320 (S310 and S320).

In S310, an electrode film is formed on the surfaces of the plurality of conductive pins 12 away from the base 10.

For example, the electrode film may be formed by using a magnetron sputtering process. For example, a material of the electrode film may be, for example, ITO or IGZO.

In S320, the electrode film is patterned to obtain the plurality of conductive electrodes 13.

For example, the electrode film may be patterned by using a photolithography process and a wet etching process.

Here, when the electrode film is patterned to obtain the plurality of conductive electrodes 13, touch electrodes 15 electrically connected to the plurality of touch signal lines 14 may also be obtained, or pixel electrodes 17 electrically connected to one of the first sources 112 or the first drains 113 of the plurality of first transistors 11 may also be obtained.

A relationship between the conductive pins 12 and the conductive electrodes 13 may be referred to the description in some embodiments as above, which will not be repeated here.

Beneficial effects that can be achieved by the method for manufacturing the array substrate provided by some embodiments of the present disclosure are the same as beneficial effects that can be achieved by the array substrate provided in some embodiments described above, and details will not be repeated here.

Figure 15:
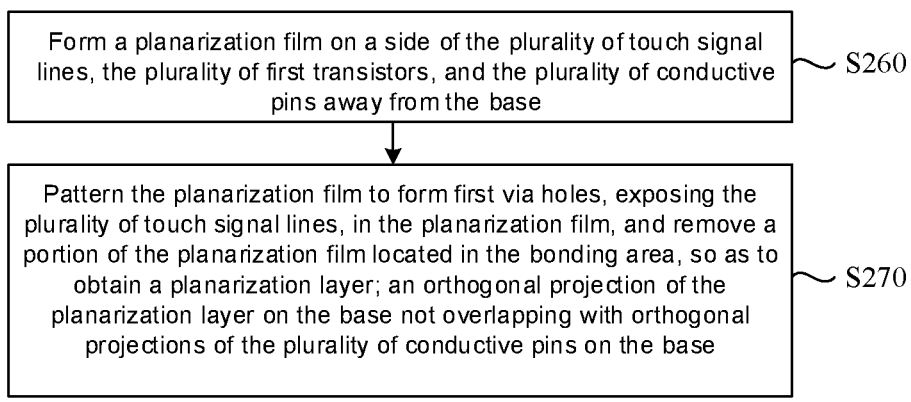
FIG. 15 is another flowchart of S200 in the flowchart shown in FIG. 13.

In some embodiments, as shown in FIG. 15, before S300, the method for manufacturing the array substrate further includes steps 260 and 270 (S260 and S270).

In S260, as shown in (g) in FIG. 16, a planarization film 16' is formed on a side of the plurality of touch signal lines 14, the plurality of first transistors 11, and the plurality of conductive pins 12 away from the base 10.

For example, the planarization film 16' is formed by using a plasma enhanced chemical vapor deposition (PECVD) process. A material of the planarization film 16' may be, for example, an organic resin.

In S270, as shown in (h) in FIG. 16, the planarization film 16' is patterned to form first via holes K1, exposing the plurality of touch signal lines 14, in the planarization film 16', and remove a portion of the planarization film 16' located in the bonding area B, so as to obtain a planarization layer 16. An orthogonal projection of the planarization layer 16 on the base 10 does not overlap with orthogonal projections of the plurality of conductive pins 12 on the base 10.

For example, the planarization film 16' may be patterned by using a photolithography process.

In the above S320, in a case where the plurality of conductive electrodes 13 are obtained and the plurality of touch electrodes 15 are also obtained, each touch electrode 15 may be electrically connected to a corresponding touch signal line 14 through at least one first via hole K1.

Figure 17:
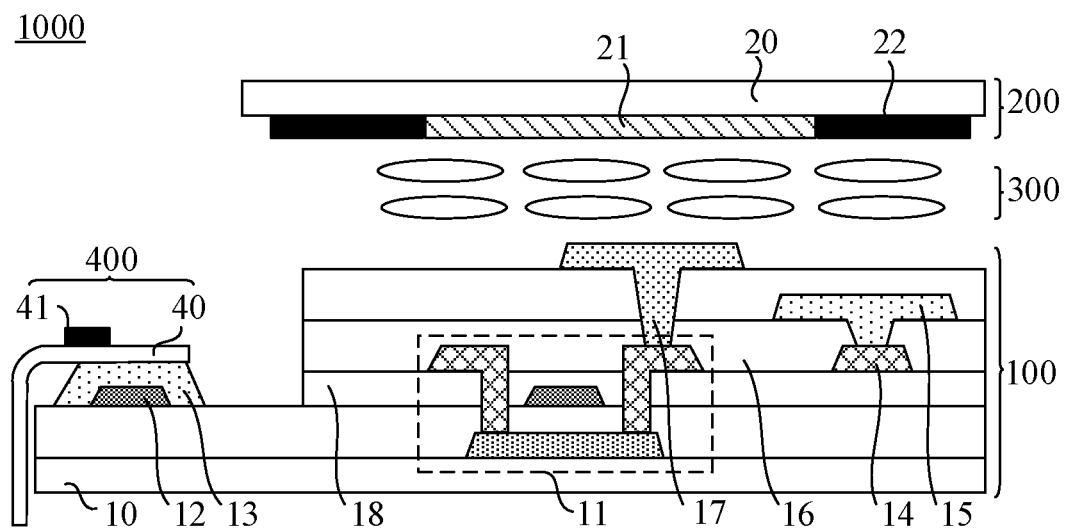
FIG. 17 is a structural diagram of a display apparatus, in accordance with some embodiments of the present disclosure.
Figure 18:
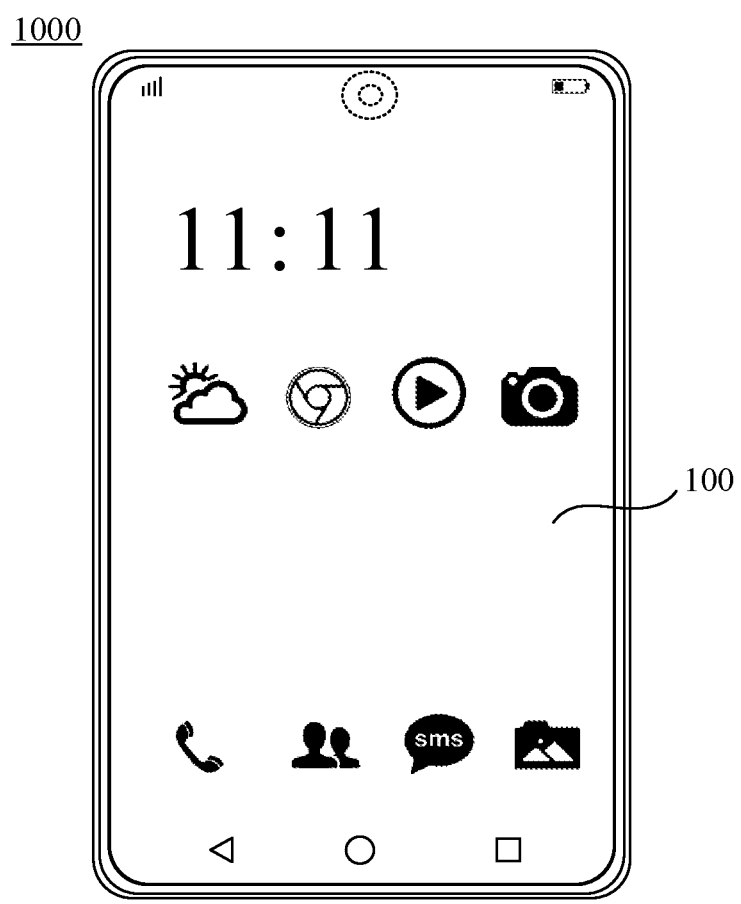
FIG. 18 is a structural diagram of another display apparatus, in accordance with some embodiments of the present disclosure.

As shown in FIGS. 17 and 18, some embodiments of the present disclosure provide a display apparatus 1000. As shown in FIG. 17, the display apparatus 1000 includes: the array substrate 100 described in some embodiments as above, an opposite substrate 200 disposed opposite to the array substrate 100, and a liquid crystal layer 300 disposed between the array substrate 100 and the opposite substrate 200.

In some embodiments, since the touch electrodes 15 in the array substrate 100 may further be used as common electrodes, as shown in FIG. 17, the opposite substrate 200 may include an opposite base 20, a color film layer 21, and a black matrix 22.

In some examples, as shown in FIG. 17, the color film layer 21 is disposed on a side of the opposite base 20 proximate to the array substrate 100. The color film layer 21 can make light that passes through the color film layer 21 and is emitted to the outside be light of a desired color.

In some examples, as shown in FIG. 17, the black matrix 22 is disposed on the side of the opposite base 20 proximate to the array substrate 100. For example, the black matrix 22 is provided with a plurality of openings therein, and the color film layer 21 is disposed in the plurality of openings. In this way, a phenomenon of color mixture of light may be avoided.

In addition, the black matrix 22 may shield the first transistors 11, the gate lines GL, the data lines DL, and the second transistors 1911 that are in the array substrate 100, so as to protect the first transistors 11 and the second transistors 1911, and prevent reflection of external light.

In some examples, as shown in FIG. 17, the liquid crystal layer 300 includes a plurality of liquid crystal molecules. During a display process of the display apparatus 1000, electric fields may be generated between the pixel electrodes 17 and the touch electrodes 15 that are in the array substrate 100 to drive the liquid crystal molecules in the liquid crystal layer 300 to deflect, so that display of an image is achieved.

The beneficial effects that can be achieved by the display apparatus 1000 provided in some embodiments of the present disclosure are the same as the beneficial effects that can be achieved by the array substrate 100 provided in some of the above embodiments, and details will not be repeated here.

In some embodiments, as shown in FIG. 17, the display apparatus 1000 further includes a chip on film 400 bonded to the plurality of conductive electrodes 13 in the array substrate 100.

In some examples, the chip on film 400 includes a flexible circuit board 40 and an integrated circuit (IC) 41 disposed on a side of the flexible circuit board 40. The flexible circuit board 40 can adhere to the plurality of conductive electrodes 13 in the bonding area B through an anisotropic conductive film (ACF).

For example, the IC 41 may transmit a common voltage to the touch electrodes 15 through the flexible circuit board 40, the conductive electrodes 13, the conductive pins 12, and the touch signal lines 14, so that the display apparatus 1000 can achieve display of the image. A capacitance provided by the touch electrode 15 may also be transmitted to the IC 41 through the touch signal line 14, the conductive pin 12, the conductive electrode 13, and the flexible circuit board 40, and a change of the capacitance provided by the touch electrode 15 can be determined, so that a determination of touch position can be achieved.

In some embodiments, the display apparatus 1000 is any product or component having a display function, such as a mobile phone, a tablet computer, a television, a display, a notebook computer, a digital frame, or a navigator.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate having a display area and a bonding area located on a side of the display area; the array substrate comprising:
   a base;
   a plurality of first transistors disposed on a side of the base and located in the display area, and a first transistor including a first gate, a first source, and a first drain;
   a plurality of conductive pins disposed on the side of the base and located in the bonding area, and the plurality of conductive pins being disposed in a same layer as the first gate; and
   a plurality of conductive electrodes each disposed on a respective one of surfaces of the plurality of conductive pins away from the base.

2. The array substrate according to claim 1, further comprising: a plurality of touch signal lines disposed on the side of the base and extending in a first direction, wherein
   the plurality of touch signal lines are disposed in a same layer as the first source and the first drain; and
   at least one touch signal line is electrically connected to one conductive pin.

3. The array substrate according to claim 2, further comprising: a plurality of touch electrodes disposed on a side of the plurality of touch signal lines away from the base, wherein
   each touch electrode is electrically connected to at least one touch signal line.

4. The array substrate according to claim 3, further comprising:
   a planarization layer disposed between the plurality of first transistors and the plurality of touch electrodes, wherein
   the planarization layer has a plurality of first via holes, and each touch signal line is electrically connected to a touch electrode through at least one first via hole; and
   an orthogonal projection of the planarization layer on the base does not overlap with orthogonal projections of the plurality of conductive pins on the base.

5. The array substrate according to claim 3, further comprising: a plurality of pixel electrodes disposed on a side of the plurality of touch electrodes away from or proximate to the base, wherein
   one of a first source and a first drain of each first transistor is electrically connected to a pixel electrode; and
   the plurality of conductive electrodes are disposed in a same layer as the plurality of touch electrodes or the plurality of pixel electrodes.

6. The array substrate according to claim 5, further comprising: a plurality of data lines disposed in a same layer as the plurality of touch signal lines and extending in the first direction, wherein
   another of the first source and the first drain of each first transistor is electrically connected to a data line; and
   at least one data line is electrically connected to one conductive pin.

7. The array substrate according to claim 2, further comprising: a plurality of connection portions, wherein
   the conductive pin is electrically connected to the at least one touch signal line through a connection portion.

8. The array substrate according to claim 7, further comprising: a plurality of touch electrodes, wherein
   the plurality of connection portions are disposed in a same layer as the plurality of touch electrodes, and each of the plurality of connection portions and a respective one of the plurality of conductive electrodes are of an integrated structure; and
   an end of the connection portion is electrically connected to the at least one touch signal line.

9. The array substrate according to claim 7, wherein the connection portion includes a multiplexer; and
   an input end of the multiplexer is electrically connected to the conductive pin, and output ends of the multiplexer is electrically connected to at least two touch signal lines.

10. The array substrate according to claim 9, wherein the multiplexer includes at least two second transistors, and a second transistor includes a second source and a second drain; and
    one of the second source and the second drain is, as the input end, electrically connected to the conductive pin, and another of the second source and the second drain is, as the output end, electrically connected to one of the at least two touch signal lines.

11. The array substrate according to claim 2, further comprising: an insulating layer disposed between a layer where the first source and the first drain are located and the first gate, wherein
    the insulating layer is provided with a plurality of second via holes therein, and each touch signal line is electrically connected to a conductive pin through at least one second via hole.

12. The array substrate according to claim 1, wherein orthogonal projections of the plurality of conductive pins on the base are each located within an orthogonal projection of a respective one of the plurality of conductive electrodes on the base.

13. The array substrate according to claim 1, further comprising: an insulating layer disposed between a layer where the first source and the first drain are located and the first gate, wherein
    an orthogonal projection of the insulating layer on the base does not overlap with orthogonal projections of the plurality of conductive pins on the base.

14. A method for manufacturing an array substrate, comprising:
    providing a base; the base having a display area and a bonding area located on a side of the display area;
    forming a plurality of first transistors and a plurality of conductive pins on a side of the base; the plurality of first transistors being located in the display area, and a first transistor including a first gate, a first source and a first drain; and the plurality of conductive pins being located in the bonding area and disposed in a same layer as the first gate; and
    forming a plurality of conductive electrodes each on a respective one of surfaces of the plurality of conductive pins away from the base.

15. The method for manufacturing the array substrate according to claim 14, wherein a step of forming the plurality of first transistors includes:
    forming a source-drain conductive film on the side of the base; and
    patterning the source-drain conductive film to remove a portion of the source-drain conductive film located in the bonding area, and form a plurality of touch signal lines, and first sources and first drains of the plurality of first transistors in the display area.

16. The method for manufacturing the array substrate according to claim 15, wherein before forming the plurality of conductive electrodes, the method for manufacturing the array substrate further comprises:

forming a planarization film on a side of the plurality of touch signal lines, the plurality of first transistors, and the plurality of conductive pins away from the base; and patterning the planarization film to form first via holes, exposing the plurality of touch signal lines, in the planarization film, and remove a portion of the planarization film located in the bonding area, so as to obtain a planarization layer; an orthogonal projection of the planarization layer on the base not overlapping with orthogonal projections of the plurality of conductive pins on the base.

17. A display apparatus, comprising:
the array substrate according to claim 1;
an opposite substrate disposed opposite to the array substrate; and
a liquid crystal layer disposed between the array substrate and the opposite substrate.

18. The display apparatus according to claim 17, further comprising: a chip on film bonded to the plurality of conductive electrodes in the array substrate.

19. The array substrate according to claim 7, further comprising: a plurality of pixel electrodes, wherein
the plurality of connection portions are disposed in a same layer as the plurality of pixel electrodes, and each of the plurality of connection portions and a respective one of the plurality of conductive electrodes are of an integrated structure; and
an end of the connection portion is electrically connected to the at least one touch signal line.

* * * * *